United States Patent
LePage

(10) Patent No.: US 7,271,507 B2
(45) Date of Patent: Sep. 18, 2007

(54) PROCESS AND SYSTEM FOR CONTROLLING AN ELECTRONIC POWER COMPONENT AND DATA RECORDING SUPPORT COMPRISING INSTRUCTIONS FOR EXECUTING THE PROCESS

(75) Inventor: Jean-Pierre LePage, Aureilhan (FR)

(73) Assignee: Alstom, Paris (FR)

( * ) Notice: Subject to any disclaimer, the term of this patent is extended or adjusted under 35 U.S.C. 154(b) by 571 days.

(21) Appl. No.: 10/773,445

(22) Filed: Feb. 9, 2004

(65) Prior Publication Data
US 2004/0220703 A1 Nov. 4, 2004

(30) Foreign Application Priority Data
Feb. 10, 2003 (FR) .................... 03 01551

(51) Int. Cl.
H02H 3/027 (2006.01)
H02H 3/247 (2006.01)
(52) U.S. Cl. ................... 307/130; 361/100
(58) Field of Classification Search ............. 307/130, 307/97; 361/18, 100; 327/432
See application file for complete search history.

(56) References Cited

U.S. PATENT DOCUMENTS

| 4,721,869 A | 1/1988 | Okado | |
| 5,467,242 A * | 11/1995 | Kiraly | 361/94 |
| 5,559,656 A | 9/1996 | Chokhawala | |
| 5,898,554 A | 4/1999 | Schnetzka et al. | |
| 6,097,582 A * | 8/2000 | John et al. | 361/79 |
| 6,194,884 B1 * | 2/2001 | Kesler et al. | 323/285 |
| 6,275,093 B1 | 8/2001 | Shekhawat et al. | |
| 2002/0167826 A1 | 11/2002 | Houchstuhl et al. | |

FOREIGN PATENT DOCUMENTS

EP 1257056 11/2002

* cited by examiner

Primary Examiner—Michael Sherry
Assistant Examiner—Andrew Deschere
(74) Attorney, Agent, or Firm—Dowell & Dowell P.C.

(57) ABSTRACT

The process for controlling an electronic power component for piloting an opening and/or closure of this component. The piloting process includes a plurality of steps for controlling the application of a succession of different commutation voltages on a control electrode of the electronic power component between an instant when the piloting process begins and an instant when either the opening or the closure of the electronic power component is to stop. Passage from one commutation voltage to a successive commutation voltage in this piloting process is automatically effected as soon as a corresponding condition of passage is satisfied. The process further includes a step of interrupting the piloting process and immediately triggering off a process for safeguarding the integrity of the electronic power component if the component does not react to a commutation voltage within a predetermined time for the commutation voltage.

18 Claims, 5 Drawing Sheets

PROCESS AND SYSTEM FOR CONTROLLING AN ELECTRONIC POWER COMPONENT AND DATA RECORDING SUPPORT COMPRISING INSTRUCTIONS FOR EXECUTING THE PROCESS

FIELD OF THE INVENTION

The present invention relates to a process and a system for controlling an electronic power component.

More precisely, this invention relates to a control process comprising a process for piloting the opening and/or closure of the electronic power component, the piloting process comprising a plurality of steps for controlling the application of a succession of different commutation voltages on a control electrode of said component between the instant when the piloting process begins and the instant when the opening and/or closure of the electronic power component must stop, the passage from one step to the following step in this piloting process being effected automatically as soon as a corresponding condition of passage is satisfied.

BACKGROUND OF THE INVENTION

Such control processes are known under the terms of CATS control and disclosed for power transistors in "*CATS Control: Assessment of the Robustness and Application to the Servo-Control of Closure*", N. IDIR, H. SAWEZYN, J. J. FRANCHAUD, R. BAUSIERE, University of Lille 1, Laboratoire L2EP.

These CATS control processes have been developed to control the derivative di/dt of the intensity of the current circulating between the collector and the emitter of the power transistor as well as the variations of the derivative dv/dt of the voltage at the terminals of the power transistor. This object is attained by applying a plurality of different successive voltages between the beginning and the end of the commutation process of the transistor. Among this succession of voltages, at least one, so-called braking voltage has an intermediate value different from those adapted to maintain the power transistor in the conducting and non-conducting states. The value of this braking voltage is chosen so as to brake commutation of the power transistor and consequently to limit and control the variations of the derivatives di/dt and dv/dt respectively upon closure and upon opening of the power transistor. The period during which this braking voltage is applied on the control electrode of the power transistor must be controlled with precision in order to limit the losses of commutation, i.e. the power consumed during each commutation. To that end, the end of the application of this braking voltage is automatically controlled when one or more conditions of passage are satisfied. For example, in the afore-cited document, the end of the application of the braking voltage is automatically controlled if the voltage at the terminals of a diode mounted in anti-parallel position with respect to the power transistor is less than a predetermined threshold and if the derivative of this same voltage is less than another threshold.

However, in the event of dysfunction of the power transistor, the condition of passage for controlling the end of the application of the braking voltage can never be satisfied. Under these conditions, the control process remains blocked, this being translated by the maintaining of the braking voltage on the control electrode of the power transistor for an undetermined duration. At best, this situation leads to consuming energy unnecessarily and, at worst, to deteriorating the power transistor.

It is an object of the present invention to overcome this drawback by proposing a control process of the CATS control type of an electronic power component, in which the unnecessary consumption of energy or the deterioration of the component is avoided.

SUMMARY OF THE INVENTION

The invention therefore relates to a control process as described hereinabove, characterized in that it comprises the following steps of:
reading the value of at least one operational parameter characteristic of the reaction of the electronic power component in response to the successive application of said commutation voltages,
verifying, thanks to the values read, whether this reaction of the electronic power component is produced in a predetermined imparted time,
if so, allowing said piloting process to continue normally, and
if not, interrupting said piloting process and immediately triggering off a process for safeguarding the integrity of the electronic power component.

In the above process, the reaction time of the electronic-power component, in response to the application of the successive commutation voltages, is supervised permanently. As soon as this reaction time exceeds a predetermined imparted time, which is the case for example in the event of dysfunction of the electronic power component, the process interrupts the opening and/or closure piloting process and automatically activates a process of safeguard. Consequently, in such a control process, it is impossible that the process piloting each opening and/or closure remains blocked. The unnecessary consumption of energy or the deterioration of the electronic power component is therefore avoided.

In accordance with other characteristics of a process according to the invention:
at least one condition of passage from one step to the following in said piloting process is a function of the values read for said at least one operational parameter and, in order to verify whether the reaction of the electronic power component is produced in the predetermined imparted time, the process comprises the step consisting in verifying that at least this condition of passage is satisfied before the predetermined imparted time has elapsed.
the process comprises the step consisting in verifying that all the conditions of passage between said plurality of steps of said piloting process are satisfied before a predetermined imparted time common to all these conditions of passage has elapsed.
the common time is counted from the instant when the execution of said piloting process begins, and this common time is representative of a maximum time to effect commutation of the electronic power component.
one of the operational parameters read is the voltage $V_{CE}$ between the collector and emitter electrodes of the electronic power component.
one of the operational parameters read is the voltage on the control electrode.
one of the steps of said piloting process consists in controlling the application on said control electrode of a braking voltage adapted to brake commutation of the electronic power component.

the value of the braking voltage is strictly included between the values of the voltages for maintaining the electronic power component respectively in the closed state and in the open state.

said piloting process is a process for piloting the closure of the electronic power component and the condition of passage between the step of controlling the application of a braking voltage and the following step is satisfied if the voltage between the collector and emitter electrodes is less than a first predetermined threshold.

the process for piloting the closure of the electronic power component begins by the step of controlling the application of the braking voltage.

said piloting process is a process for piloting the opening of the electronic power component and the condition of passage between a preceding step and the step controlling the application of the braking voltage is satisfied if the voltage between the collector and emitter electrodes is greater than a second predetermined threshold.

the value of the second threshold corresponds to half the voltage to be commuted.

said preceding step is a step for controlling the application of a voltage of value strictly lower than that of the braking voltage.

in the process for piloting the opening of the electronic power component, the condition of passage between the step controlling the application of the braking voltage and a following step is satisfied if the voltage between the collector and emitter electrodes attains a maximum.

The invention also relates to a system for controlling an electronic power component adapted to execute a process for piloting the opening and/or closure of this component, said piloting process containing a plurality of steps for controlling the application of a succession of different commutation voltages on a control electrode of the electronic power component between the instant when said piloting process starts and the instant when the opening and/or closure of the electronic power component must finish, the passage from one step to the following step in this piloting process being automatically effected as soon as a corresponding condition of passage is satisfied, characterized in that the system comprises a computer adapted to:

read the value of at least one operational parameter characteristic of the reaction of the electronic power component in response to the successive application of said commutation voltages, verify, thanks to the values read, whether this reaction of the electronic power component is produced in a predetermined imparted time, if so, allow said piloting process to continue normally, and if not, interrupt said piloting process and immediately trigger off a process for safeguarding the integrity of the electronic power component.

In accordance with other characteristics of a control system according to the invention:

at least one condition of passage from one step of said piloting process to the following is a function of the values read for said at least one operational parameter and, in order to verify whether the reaction of the electronic power component is produced in the predetermined imparted time, the computer is adapted to verify that at least one condition of passage is satisfied before a predetermined time imparted for this condition of passage has elapsed.

the computer is adapted to verify that all the conditions of passage between said plurality of steps of said piloting process are satisfied before a predetermined imparted time common to all these conditions of passage has elapsed.

The invention also relates to a data recording support comprising instructions for the execution of the steps of a process for controlling an electronic power component according to the invention, when said instructions are executed by a computer.

BRIEF DESCRIPTION OF THE DRAWINGS

The invention will be more readily understood on reading the following description given by way of non-limiting example with reference to the accompanying drawings, in which.

DESCRIPTION OF PREFERRED EMBODIMENT

Figure 1:
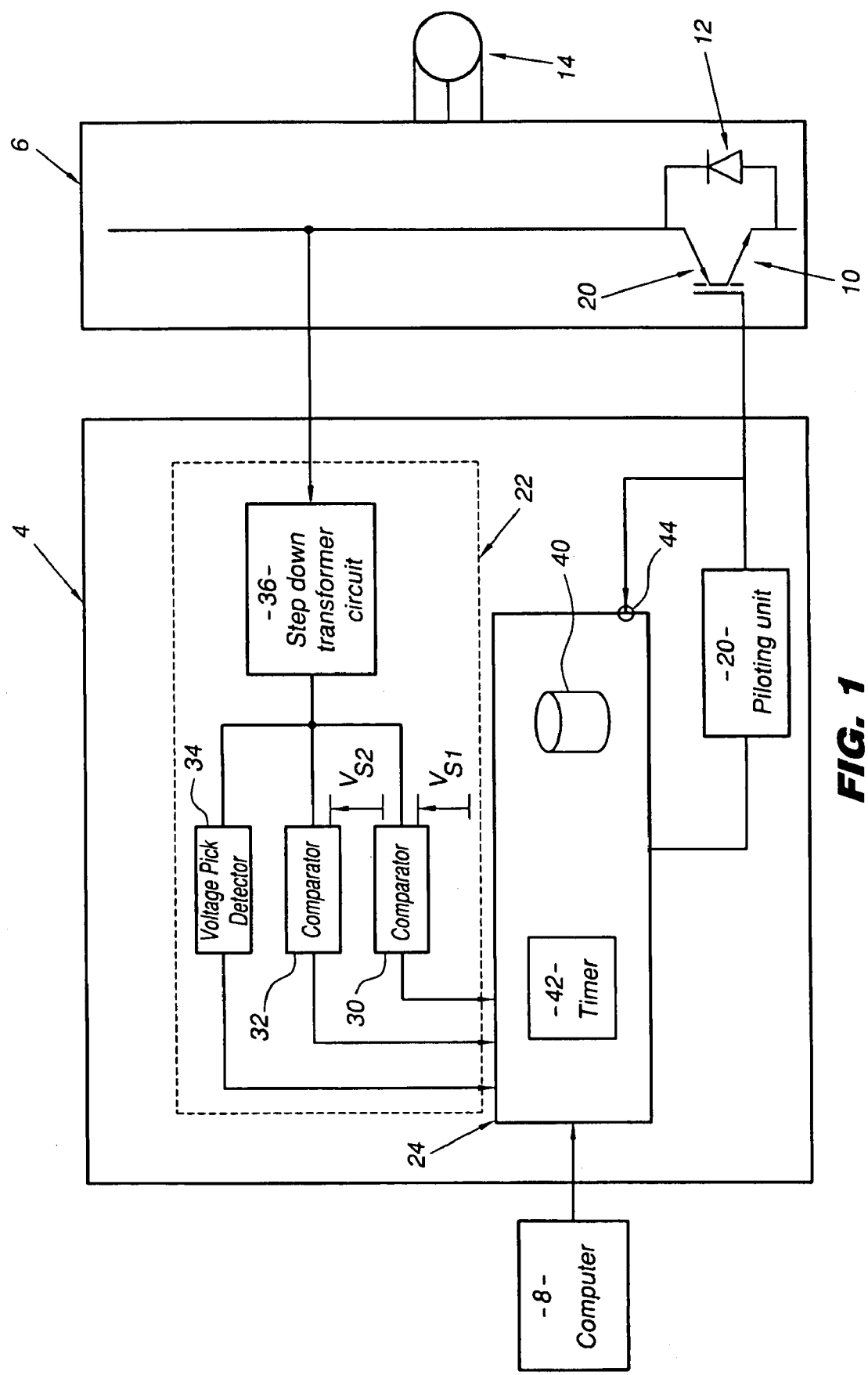
FIG. 1 is a schematic illustration of the architecture of a system according to the invention.

Referring now to the drawings, FIG. 1 shows an electronic igniter 4 adapted to control the power transistors of an electronic commutation device 6 as a function of orders transmitted by a computer 8.

The commutation device 6 is for example a conventional three-phase inverter made from IGBT (Insulated Gate Bipolar Transistor) power transistors 10 and diodes 12 connected in anti-parallel position between the collector and the emitter of each of the transistors 10.

The transistor 10 is typically capable of commuting currents going up to 1000 A and of withstanding a voltage $V_{CE}$ between the collector and the emitter in the non-conducting state, i.e. in the open state, included between 250 and 4000 V. In the conducting state, i.e. in the closed state, the voltage $V_{CE}$ is generally less than 5 V.

In order to simplify the illustration, only one of these transistors 10 and one of these diodes 12 are shown here.

This three-phase inverter 6 is for example intended to supply a rotating electric machine 14. Under these conditions, the function of the computer 8 is to deliver to the igniter 4 orders for controlling the power developed by the machine 14, and the function of the igniter is to convert these orders into instructions for controlling each of the power transistors 10. The process of conversion of the orders delivered by the computer into instructions for controlling each of the power transistors is conventional and will not be described here.

Only those elements of the igniter 4 necessary for understanding the novel control system described here are shown in FIG. 1. Moreover, as the control system employed in the igniter 4 is the same for each of the power transistors 10, only the control system of one of these power transistors will be described here in detail.

The igniter 4 comprises a unit 20 for piloting the voltage $V_{GE}$ applied to the gate of the transistor 10, a circuit 22 for acquisition of data relative to the voltage $V_{CE}$ between the collector and the emitter of the transistor 10, and a logic processing unit 24 adapted, from the information delivered by the circuit 22, to control the piloting unit 20.

The piloting unit 20 is adapted to apply, on the gate of the transistor 10, four different voltages $V_{15}$, $V_{10}$, $V_0$ and $V_{-10}$ corresponding respectively to a voltage for maintaining the transistor in the conducting state, for braking the commutation of the transistor, for blocking the transistor and for maintaining the transistor in the non-conducting state. Conventionally, voltages $V_5$ and $V_0$ are respectively equal to +15 V and 0 V. The value of the braking voltage is preferably strictly included between those of the voltages $V_0$ and $V_{15}$ and for example chosen here to be equal to 10 V.

The voltage $V_{-10}$ is adapted to maintain the power transistor 10 in the non-conducting state, even if said voltage is disturbed, for example because of electromagnetic disturbances caused by the commutation of other power transistors located nearby. To that end, its value is chosen to be clearly lower than that of the blocking voltage so that a disturbance cannot modify this value to render it higher than the blocking voltage, which would risk bringing about a non-controlled commutation of the power transistor 10. Here, this value is chosen to be equal to −10 V.

The data acquisition circuit 22 comprises three circuits 30, 32 and 34 for analyzing data relative to the voltage $V_{CE}$ and a step-down transformer circuit 36 connected to the input of each of these three analysis circuits.

The circuit 36 is intended to transform the voltage $V_{CE}$ taken at the collector of the transistor 10 into a voltage which is proportional but included between 0 and 5 V delivered at the input of the three analysis circuits 30 to 34.

The circuit 30 is a conventional analog comparator intended to compare the voltage delivered by the circuit 36 with a threshold $S_1$ and to deliver the result of this comparison to the logic processing unit 24. The value of the threshold $S_1$ corresponds here to a value of the voltage $V_{CE}$ below which it is admitted that the transistor 10 is in the conducting state. The value of threshold $S_1$ is constant and preferably chosen to be less than 50 V and here equal to 10 V.

The circuit 32 is also a conventional analog comparator adapted to compare the voltage delivered by the step-down transformer circuit 36 with a threshold $S_2$ and to deliver the result of this comparison to the logic processing unit 24. The value of the threshold $S_2$ is, here, constant and chosen to correspond substantially to half the voltage $V_{CE}$ to be commuted. Here, the value of $S_2$ is chosen to be equal to 500 V.

The circuit 34 is adapted to detect the voltage peak $V_{CE}$ which is produced just before the transistor 10 has finished its commutation towards the non-conducting state and to deliver this information to the logic processing unit 24. The circuit 34 is also made in conventional manner with the aid, for example, of analog components.

The logic processing unit 24 is a computer forming machine with finite states, capable of passing automatically from a state of controlling the piloting unit 20 to another when a condition of passage to the following state is satisfied. The logic processing unit 24 is, here, adapted to execute instructions recorded on a data recording support 40. This recording support 40 contains, here, instructions for executing the steps of the processes described hereinbelow with reference to FIGS. 3 and 4.

Figure 2:
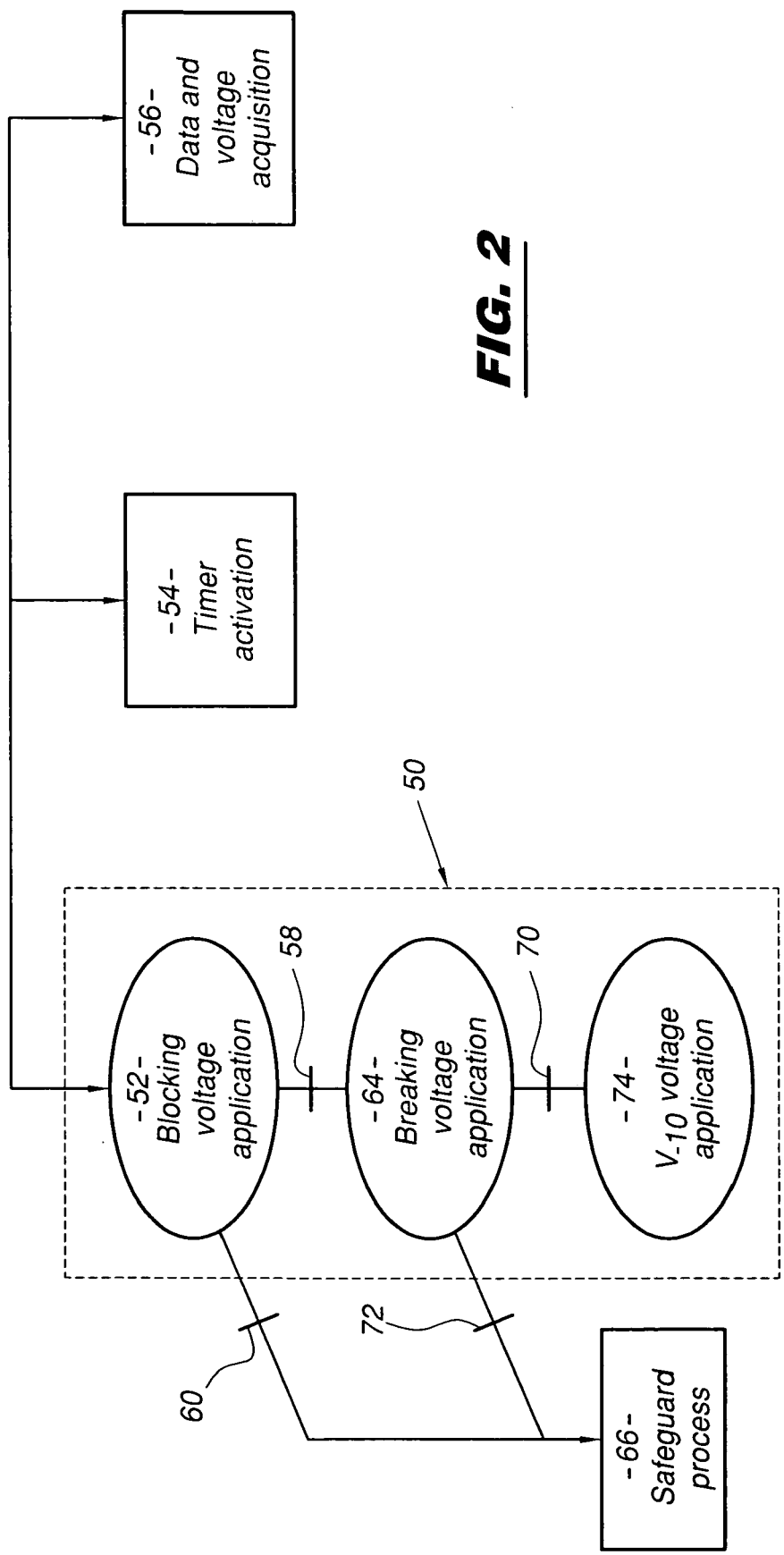
FIG. 2 is a flowchart of a process for controlling the opening of an electronic power component according to the invention.
Figure 4:
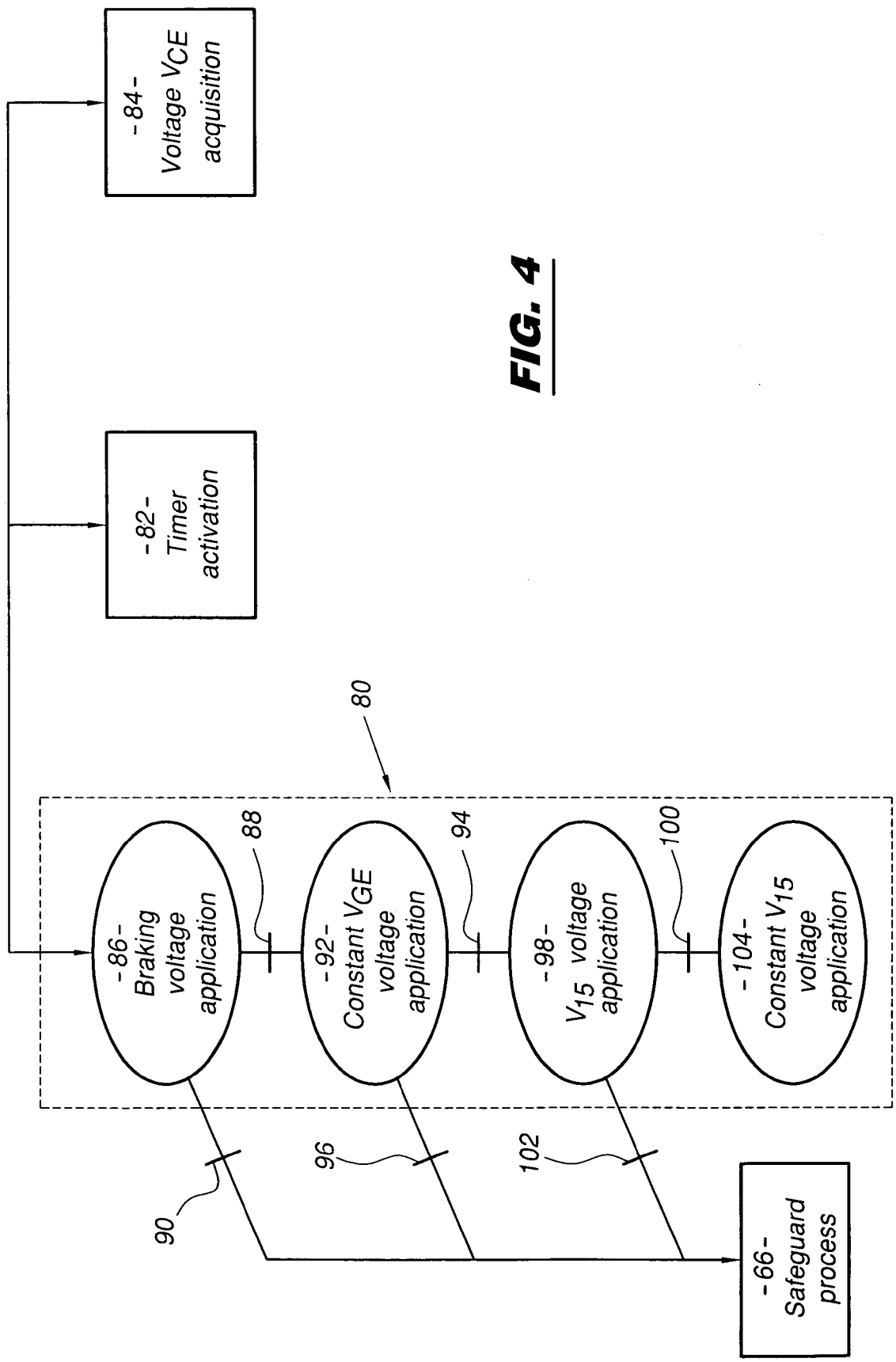
FIG. 4 is a flowchart of a process for controlling the closure of an electronic power component according to the invention.

Moreover, on this data recording support 40 there are also recorded the parameters necessary for the development of the process of FIGS. 2 and 4 and in particular two constants $T_{MAX\ OPENING}$ and $T_{MAX\ CLOSURE}$ corresponding to the maximum times for respectively passing from the non-conducting state to the conducting state, and vice versa.

So as to present a good insensitivity to the disturbances of the ambient medium, the logic processing unit 24 is advantageously a CPLD (Complex Programmable Logic Device) component programmed in a VHDL (Very High Descriptive Language).

Moreover, the logic processing unit 24 controls a timer 42 adapted to be triggered off at the beginning of each commutation of the transistor 10 and an input 44 for reading the voltage $V_{GE}$ on the gate of the transistor 10.

Figure 5A:
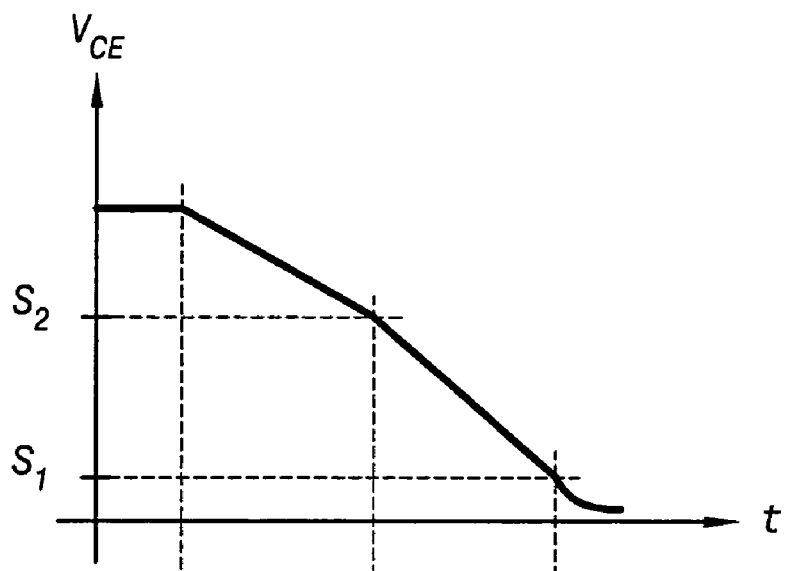
FIGS. 5A and 5B are graphs, each illustrating the evolution in the course of time of an operational parameter of the electronic power component during the application of the process of FIG. 4.
Figure 5B:
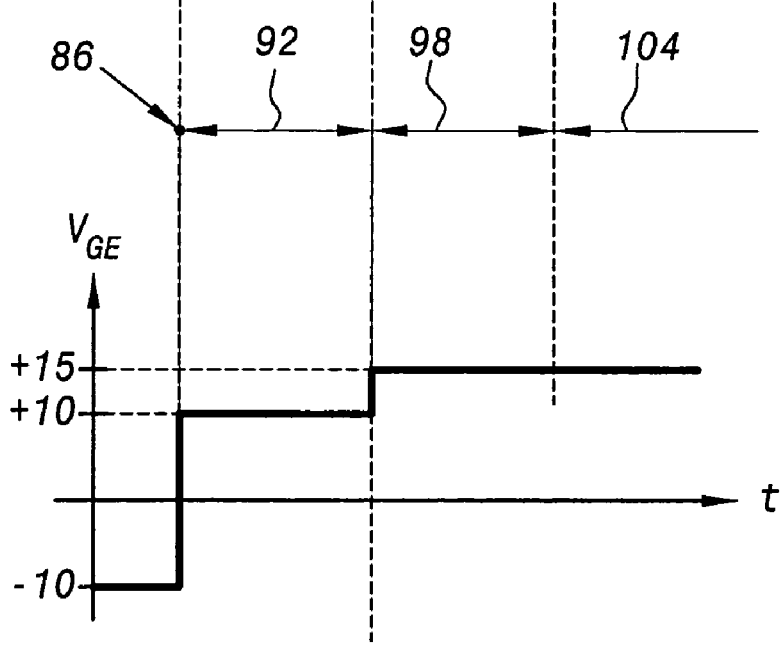

Functioning of the igniter 4 will now be described, firstly in the case of the control of the opening of the transistor 10 with reference to FIGS. 2, 3A and 3B, and then in the case of the control of the closure of the transistor 10 with reference to FIGS. 4, 5A and 5B.

The logic processing unit 24 triggers off a process 50 for piloting the opening of the transistor 10 at a determined instant, for example, as a function of the orders transmitted by the computer 8.

Simultaneously, the logic processing unit 24 activates, at step 54, the timer 42 and permanently reads, during step 56, the data transmitted by the acquisition circuit 22 and the voltage $V_{GE}$.

The process 50 aims at braking the opening of the transistor 10 in order to control the variations of the derivative $dV_{CE}/dt$.

Figure 3A:
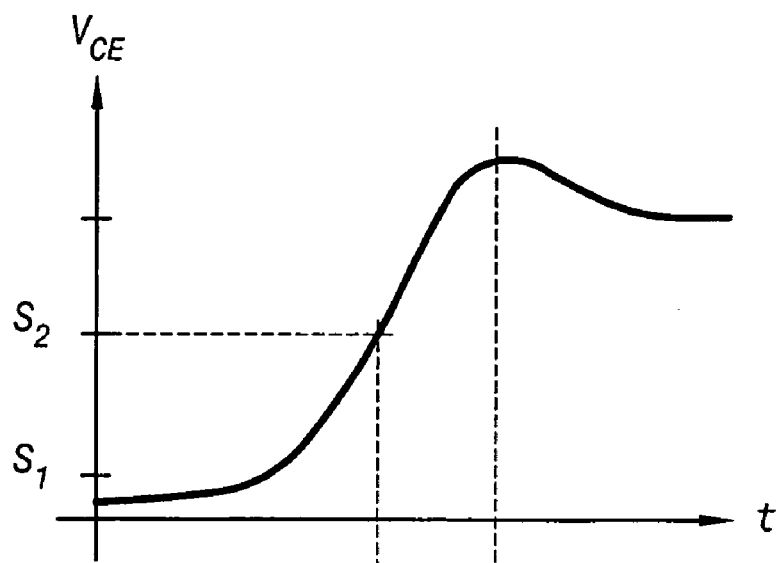
FIGS. 3A and 3B are graphs, each illustrating the evolution in the course of time of an operational parameter of the electronic power component during the application of the process of FIG. 2.
Figure 3B:
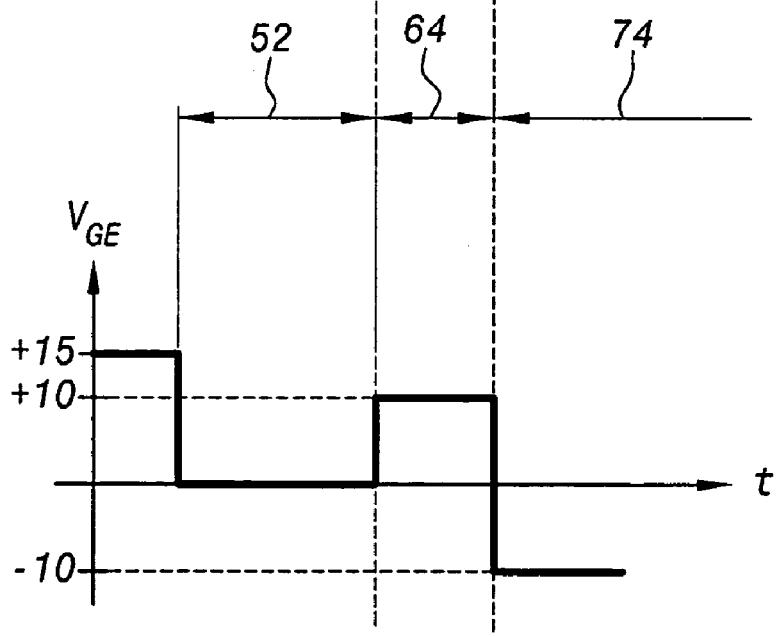

The evolution of the voltage $V_{CE}$ and of the voltage $V_{GE}$ during the normal development of the process 50 is respectively represented in FIGS. 3A and 3B. On these graphs, the time scale has been divided into three periods, each corresponding to the steps of the process 50 and therefore bearing the same numbers.

The process 50 begins by a step 52 during which the logic processing unit 24 controls the piloting unit 20 so that the latter applies the blocking voltage $V_0$ on the gate of the transistor 10.

During this step, the voltage $V_{GE}$ is therefore normally zero and the voltage $V_{CE}$ must begin to increase. This step automatically stops when one of the two conditions of passage 58 or 60 is satisfied.

The condition of passage 58 is satisfied when the comparator 32 indicates to the logic processing unit 24 that the voltage $V_{CE}$ is higher than the threshold $S_2$. If this condition 58 is satisfied before the condition of passage 60, the logic processing unit automatically proceeds to step 64.

The condition of passage 60 is satisfied as soon as the timer 42 indicates that the duration $T_{MAX\ OPENING}$ has elapsed. If this condition of passage 60 is satisfied before the condition of passage 58, then the piloting process 50 is interrupted and a process of safeguard 66 is activated.

At step 64, the logic processing unit controls the piloting unit 20 so that the latter applies on the gate of the transistor 10 the braking voltage $V_{-10}$. In this way, during this step 64, the voltage $V_{GE}$ must normally be equal to 10 V and the voltage $V_{CE}$ must continue to increase.

Step 64 stops as soon as one of the conditions of passage 70 or 72 is satisfied.

The condition of passage 70 is satisfied when the circuit 34 delivers to the logic processing unit 24 a datum according to which the voltage $V_{CE}$ has attained its maximum, i.e. the point where the derivative is cancelled. If this condition 70 is satisfied before condition 72, the logic processing unit automatically proceeds to step 74 of the process 50.

The condition of passage 72 is satisfied as soon as the timer indicates that the time elapsed since the beginning of the process 50 is greater than the duration $T_{MAX\ OPENING}$. If this condition of passage 72 is satisfied before condition 70, the logic processing unit 24 automatically and immediately proceeds with the interruption of the process 50 and with the execution of the process 66 of safeguard.

At step 74, the logic processing unit controls the piloting unit 20 so that the latter applies the voltage $V_{-10}$ on the gate of the transistor 10 in order to maintain the transistor 10 in the non-conducting state.

After step 74, the process 50 ends, since the commutation of the transistor 10 is finished. The logic processing unit then controls the maintenance of the voltage $V_{-10}$ as long as no new order of commutation has been received.

During the safeguarding process 66, the logic processing unit 24 controls the piloting unit 20 so that it immediately applies the voltage $V_{10}$ for maintaining the transistor 10 in the non-conducting state. Moreover, a failure of commutation for opening is indicated, for example, to the computer 8 in order that this information be possibly subjected to particular processing.

FIG. 4 represents the process for controlling closure of the transistor 10.

The logic processing unit 24 triggers off a process 80 for piloting the closure of the transistor 10 at a determined instant, for example, as a function of the orders transmitted by the computer 8.

Simultaneously, the logic processing unit 24 activates, in step 82, the timer 42 and permanently reads, in step 84, the data relative to the voltage $V_{CE}$ transmitted by the acquisition circuit 22 and the voltage $V_{GE}$.

The process 80 aims at braking closure of the transistor 10 in order to control the variations of the derivative $di_E/dt$ of the current circulating in the transistor 10. The evolution of the voltage $V_{CE}$ and of the voltage $V_{GE}$ during normal development of the process 80 are respectively represented in FIGS. 5A and 5B.

In these graphs, the time scale has been divided into three periods each corresponding to the steps of the process 80 and therefore bearing the same numbers.

The process 80 begins by a step 86 for controlling the application of the braking voltage $V_{10}$.

Step 86 ends as soon as one of the conditions of passage 88 or 90 is satisfied. This step normally being very short with respect to the others, it has been represented by a dot in FIGS. 5A, 5B.

The condition of passage 88 is satisfied as soon as the voltage $V_{GE}$ read by the logic processing unit 24 is greater than or equal to 10 V. If the condition of passage 88 is satisfied before condition of passage 90, the logic processing unit 24 automatically proceeds to step 92 for maintaining a voltage $V_{GE}$ equal to 10 V.

During step 92, the voltage $V_{GE}$ is therefore normally equal to 10 V and the voltage $V_{CE}$ begins to decrease.

The step 92 ends as soon as a condition of passage 94 or 96 is satisfied. The condition of passage 94 is satisfied here as soon as the analog comparator 32 indicates to the logic processing unit 24 that the voltage $V_{CE}$ is lower than the threshold $S_2$. If the condition of passage 94 is satisfied before condition 96, the logic processing unit 24 automatically proceeds to a step 98 for controlling the piloting unit 20 so that the latter applies on the gate 10 the voltage $V_{15}$ for maintaining the transistor 10 in the conducting state.

Step 98 terminates as soon as a condition of passage 100 or 102 is satisfied. The condition of passage 100 is satisfied here as soon as the voltage $V_{CE}$ is lower than the threshold $S_1$. If the condition of passage 100 is satisfied before condition 102, the logic processing unit 24 then proceeds automatically to step 104 for controlling maintenance of the voltage $V_{15}$ on the gate of the transistor 10. The piloting process 80 is finished.

The conditions 90, 96 and 102 are automatically satisfied as soon as the timer 42 indicates that the time elapsed since the beginning of the process 80 is greater than the duration $T_{MAX\ CLOSURE}$. If one of these conditions is satisfied, while one of the steps 86, 92 or 98 has not yet ended, the logic processing unit 24 interrupts the process 80 and immediately begins execution of the safeguarding process 66 described with reference to FIG. 2.

It is important to note that, in the form of embodiment described here, the logic processing unit 24, in addition to executing piloting processes for braking the opening and closure of the transistor 10, permanently supervises the correct development of these processes in time. In particular, the logic processing unit 24 here supervises whether the conditions of passage from one step to the following in the piloting processes are satisfied in a predetermined period of time corresponding to a maximum duration for the piloting process to be ended. As soon as the logic processing unit 24 ascertains that not all the steps of the piloting process have been carried out within the time imparted, it interrupts this piloting process and immediately executes a safeguarding process 66. In this way, the process described hereinabove avoids any blocking of the piloting process.

The values of the thresholds for the processes for piloting the opening and closure of the transistor 10 have been chosen to be identical. In a variant, the values of the thresholds for the process for piloting opening of the transistor 10 are different from those for piloting closure thereof.

What is claimed is:

1. A process for controlling an electronic power component comprising a piloting process for piloting an opening and a closing of the electronic power component, said piloting process having a plurality of steps for controlling an application of a succession of different commutation voltages on a control electrode of the electronic power component between an instant when said piloting process begins and an instant when either the opening and the closing of the electronic power component should be completed, wherein passage from one commutation voltage to a successive commutation voltage in said piloting process is effected automatically as soon as a corresponding condition of passage is satisfied, said piloting process including the steps of:

reading a value of at least one operational parameter characteristic of a reaction of the electronic power component in response to a commutation voltage, verifying, based on the values read, whether the reaction of the electronic power component to the commutation voltage is produced within a predetermined time for the commutation voltage, if the reaction of the electronic power component is produced within the predetermined time for the commutation voltage, allowing said piloting process to continue to a successive commutation voltage, and if the reaction of the electronic power component is not produced within the predetermined time for the commutation voltage, interrupting said piloting process and triggering off a process for safeguarding the integrity of the electronic power component.

2. The process of claim 1, wherein at least one condition of passage from the commutation voltage to the successive commutation voltage in said piloting process is a function of the value read for said at least one operational parameter, and verifying whether the reaction of the electronic power component to the commutation voltage is produced within the predetermined time for the commutation voltage includes verifying that said at least one condition of passage is satisfied before said predetermined time for the commutation voltage has elapsed.

3. The process of claim 2, wherein said piloting process further includes the step of verifying that every condition of passage between each commutation voltage of said succession of different commutation voltages of said piloting process is satisfied before a predetermined time common to every condition of passage has elapsed.

4. The process of claim 3, wherein said predetermined time common to every condition of passage is counted from the instant when said piloting process begins and is representative of a maximum time to effect commutation of the electronic power component.

5. The process of claim 1, wherein said at least one operational parameter is a voltage between a collector electrode and an emitter electrode of the electronic power component.

6. The process of claim 1, wherein said at least one operational parameter is a voltage on the control electrode of the electronic power component.

7. The process of claim 1, wherein said piloting process further includes the step of controlling an application on the control electrode of a braking voltage adapted to brake commutation of the electronic power component.

8. The process of claim 7, wherein said braking voltage has a value that is strictly included between values of voltages for maintaining the electronic power component in a closed state and in an open state.

9. The process of claim 7, wherein said piloting process is a process for piloting the closure of the electronic power component, and wherein a condition of passage between the step of controlling the application of said braking voltage and a following step is satisfied if a voltage between a collector electrode and an emitter electrode of the electronic power component is less than a first predetermined threshold.

10. The process of claim 9, wherein said piloting process begins with the step of controlling the application of said braking voltage.

11. The process of claim 7, wherein said piloting process is a process for piloting the opening of the electronic power component, and wherein a condition of passage between a preceding step and the step of controlling the application of said braking voltage is satisfied if a voltage between a collector electrode and an emitter electrode of the electronic power component is higher than a second predetermined threshold.

12. The process of claim 11, wherein said second predetermined threshold has a value that corresponds to half of a voltage to be commuted.

13. The process of claim 11, wherein the preceding step before the step of controlling the application of said braking voltage is a step for controlling an application of a voltage having a value lower than a value of said braking voltage.

14. The process of claim 11, wherein a condition of passage between the step of controlling the application of said braking voltage and a following step is satisfied if the voltage between the collector electrode and the emitter electrode of the electronic power component attains a maximum.

15. A system for controlling an electronic power component, said system is adapted to execute a piloting process for piloting an opening and a closing of the electronic power component, said piloting process having a plurality of steps for controlling an application of a succession of different commutation voltages on a control electrode of the electronic power component between an instant when said piloting process begins and an instant when either the opening and the closing of the electronic power component should be completed, wherein passage from one commutation voltage to a successive commutation voltage in said piloting process is automatically effected as soon as a corresponding condition of passage is satisfied, said system comprising:

a computer connecting to a piloting unit for supplying the succession of different commutation voltages to the electronic power component, means for reading a value of at least one operational parameter characteristic of a reaction of the electronic power component in response to a commutation voltage and for inputting the value to said computer, wherein said computer includes means for verifying based on the input of the value to the computer, whether the reaction of the electronic power component to the commutation voltage is produced within a predetermined time for the commutation voltage, and if the reaction of the electronic power component is produced within the predetermined time for the commutation voltage, then permitting said piloting process to continue to a successive commutation voltage, and if the reaction of the electronic power component is not produced within the predetermined time for the commutation voltage, then interrupting said piloting unit to and trigger off a process for safeguarding an integrity of the electronic power component.

16. The system of claim 15, wherein at least one condition of passage from one commutation voltage of said piloting process to a successive commutation voltage is a function of the values read for said at least one operational parameter, and wherein said computer further includes means for verifying that said at least one condition of passage is satisfied before the predetermined time for the commutation voltage has elapsed to verify whether the reaction of the electronic power component to the commutation voltage is produced within the predetermined time for the commutation voltage.

17. The system of claim 16, wherein said computer further includes means for verifying that every condition of passage between each commutation voltage of said succession of different commutation voltages of said piloting process is satisfied before a predetermined time common to every condition of passage has elapsed.

18. The system of claim 15, further comprising a data recording support having instructions adapted to be executed by the computer to execute said piloting process.

* * * * *